US007160799B2

(12) United States Patent
Lytle et al.

(10) Patent No.: US 7,160,799 B2
(45) Date of Patent: Jan. 9, 2007

(54) DEFINE VIA IN DUAL DAMASCENE PROCESS

(75) Inventors: Steven Alan Lytle, Orlando, FL (US); Thomas Michael Wolf, Orlando, FL (US); Allen Yen, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 203 days.

(21) Appl. No.: 10/603,041

(22) Filed: Jun. 24, 2003

(65) Prior Publication Data

US 2005/0067710 A1 Mar. 31, 2005

Related U.S. Application Data

(62) Division of application No. 09/454,003, filed on Dec. 3, 1999, now abandoned.

(60) Provisional application No. 60/115,780, filed on Jan. 13, 1999.

(51) Int. Cl.
*H01L 21/4763* (2006.01)
(52) U.S. Cl. ................................ 438/637; 257/E21.579; 257/E23.151; 257/E23.169
(58) Field of Classification Search ................ 438/618, 438/622, 637
See application file for complete search history.

(56) References Cited

U.S. PATENT DOCUMENTS

| 5,604,059 | A |   | 2/1997  | Imura et al.          | 430/5   |
|-----------|---|---|---------|-----------------------|---------|
| 6,060,380 | A | * | 5/2000  | Subramanian et al.    | 438/618 |
| 6,162,587 | A | * | 12/2000 | Yang et al.           | 430/314 |

FOREIGN PATENT DOCUMENTS

| EP | 0 394 722 A2    |   | 4/1990  |
|----|-----------------|---|---------|
| EP | 0 394722        | * | 10/1990 |
| EP | 0 459 772 A2    |   | 5/1991  |
| GB | 2 330 453 A     |   | 4/1999  |
| GB | 2 345 791 A     |   | 7/2000  |
| WO | WO 95/08840 A1  |   | 3/1995  |

\* cited by examiner

*Primary Examiner*—Alexander Ghyka (57) ABSTRACT

The invention includes a process for manufacturing an integrated circuit, comprising providing a substrate comprising a dielectric layer over a conductive material, depositing a hardmask over the dielectric layer, applying a first photoresist over the hardmask and photodefining a trench, etching the hard mask and partially etching the dielectric to form a trench having a bottom, stripping the photoresist, applying a second photoresist and photodefining a slit across the trench, selectively etching the dielectric from the bottom of the trench down to the underlying conductive material. Both the hardmask and the second photoresist are used as a mask. Later, a connection to the underlying metal is formed and integrated circuits made thereby.

14 Claims, 7 Drawing Sheets

SECTION 6B

SECTION 5B

SECTION 6B

SECTION 7B

SECTION 8B

DEFINE VIA IN DUAL DAMASCENE PROCESS

CROSS-REFERENCE TO RELATED APPLICATION

This is a divisional of application Ser. No. 09/454,003, filed on Dec. 3, 1999 now abandoned.

This patent application claims priority from U.S. provisional patent application Ser. No. 60/115,780, filed on Jan. 13, 1999.

FIELD OF THE INVENTION

The present invention is directed, in general, to integrated circuits and, more specifically, to integrated circuit lithography.

BACKGROUND OF THE INVENTION

Dual damascene structures are well known in semiconductor integrated circuit manufacturing. A typical dual damascene structure comprises two IC levels in each of which was formed a trench or a via, which were subsequently filled with a conductor. Dual damascene technology can be used to create a multilayer interconnect in which conductors at two or more levels of the IC structure and interconnected by vias extending between the layers. A problem that is encountered in creating such structures is the need to accurately align one layer with another so that the vias connect the conductors as intended. This problem is exacerbated as feature sizes shrink.

Techniques are known to secure alignment include the define-via-first and define-trench-first methods. In the define-via-first method, often a high dielectric constant etch stop layer is used during the via etch after forming the trench. Disadvantageously, using an etch stop can increase parasitic capacitance between conductors, reducing circuit performance. In the define-trench-first method, contacts and vias are defined after the trench formation. This requires the photolithographic apparatus to have a large depth of focus. However, small depth of focus associated with current photo resist processes gives rise to difficulties in achieving desired via size and definition, as well as so-called resist scumming. Moreover, this requirement for large depth of focus becomes increasing difficult to achieve as feature sizes shrink.

Furthermore, there are intrinsic alignment problems when employing these processes. For example, misalignment of the via during photolithography may cause localized deviations in trench size where the vias are formed. Moreover, the misalignment of the via to the trench level will cause the via to be of a smaller size and an unusual shape, such as half-moon in the case of partial overlap. One possible solution is to make the trench wider than the via to account for the misalignment tolerances. However, this is inconsistent with the trend toward smaller feature sizes. Another difficulty relates to the fact that it is desirable for the vias to be of square cross-section because this increases the area, and hence decreases electrical resistance, between layers. However, attempts to make square vias from masks of square aperture generally fail when feature sizes shrink to about 0.5 micron or less. Specifically, rounded vias are produced; this effect believed to stem from photoresist surface-tension effects. This leads to vias of lower-than-desired cross-sectional area and higher series resistance than the case of square vias.

SUMMARY OF THE INVENTION

In accordance with the present invention the problems of the prior art are addressed by defining the via or contact by the intersection of two elongated mask openings, each opening in a separate mask, and using at least one of the mask openings to define the location of a conductor to which that via or contact is to be connected. This approach provides at least the dual benefits of substantially square vias and better alignment between the via or contact and the aforementioned conductor.

An illustrative embodiment of the invention is a process for manufacturing an integrated circuit comprising providing a substrate comprising a dielectric layer over a conductive material, depositing a hardmask over the dielectric layer, applying a first photoresist over the hardmask and photodefining a trench, etching the hard mask and partially etching the dielectric to form a trench having a bottom, stripping the photoresist, applying a second photoresist and photodefining a slit across the trench, selectively etching the dielectric from the bottom of the trench down to the underlying conductive material, wherein both the hardmask and the second photoresist are used as a mask, whereby a connection to the underlying metal is formed and integrated circuits made thereby. Accordingly, the present invention provides a method to improve the processing of dual damascene structures and further provides the elimination of a prior art high dielectric constant etch stop layer through the use of a one direction self-aligned contact and via process. Also, in accordance with the invention, an integrated circuit is provided, comprising at least one connection, wherein the at least one connection has substantially a quadrilateral cross-section, wherein the quadrilateral has a feature size of about 0.5 micron or less.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

As indicated above, the problems of the prior art are solved by defining the via or contact by the intersection of two elongated mask openings or slits, each opening in a separate mask, and using at least one of the mask openings to define the location of a conductor to which that via or contact is to be connected. If the slit in each mask is an elongated rectangle and the slits in each mask are intersecting perpendicular to each other, say a lower mask has a slit extending in the X direction of the plane of the mask and a upper mask has a slit extending in the Y direction, the intersection will define a square located at $X_1, Y_1$. Moreover, if the lower mask is fixed and the upper mask is free to slide back and forth in the Y direction, the slit in the Y direction may be slid as far one likes, and as long as at least a portion of the Y slit still intersects the X slit, then the square that is defined by the intersection remains at $X_1, Y_1$. Therefore, the combined masks will be semi-self aligning in the Y direction, and the mask positioning in this direction will be less critical.

Figure 1:
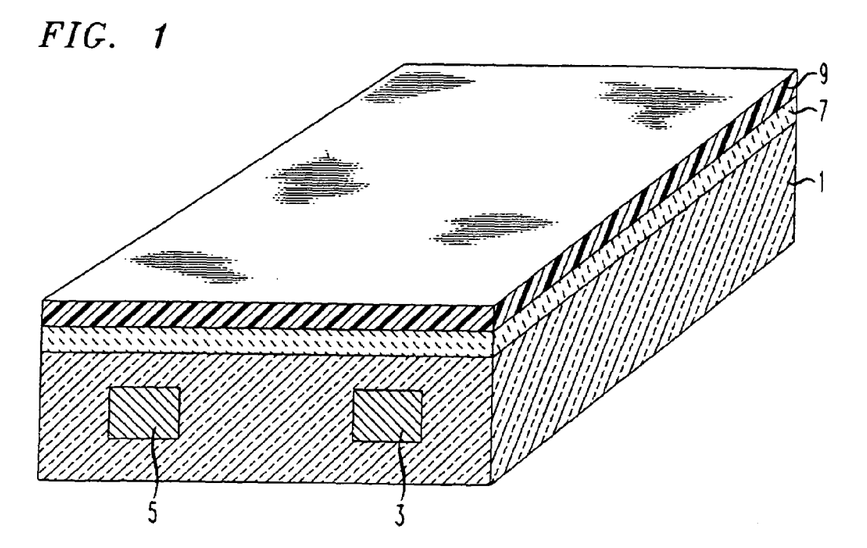
FIG. 1 is a perspective view of a dielectric comprising two conductors and having applied thereon a hardmask and a first photoresist for one embodiment of the invention.
Figure 2:
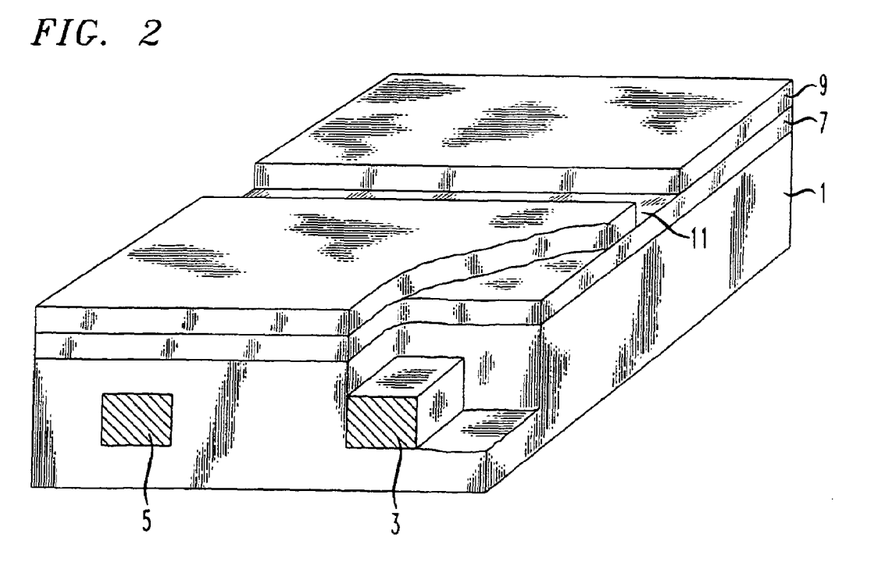
FIG. 2 is a perspective and cut-away view of the above embodiment wherein the first photoresist has had an opening for etching a trench photodefined therein.
Figure 3:
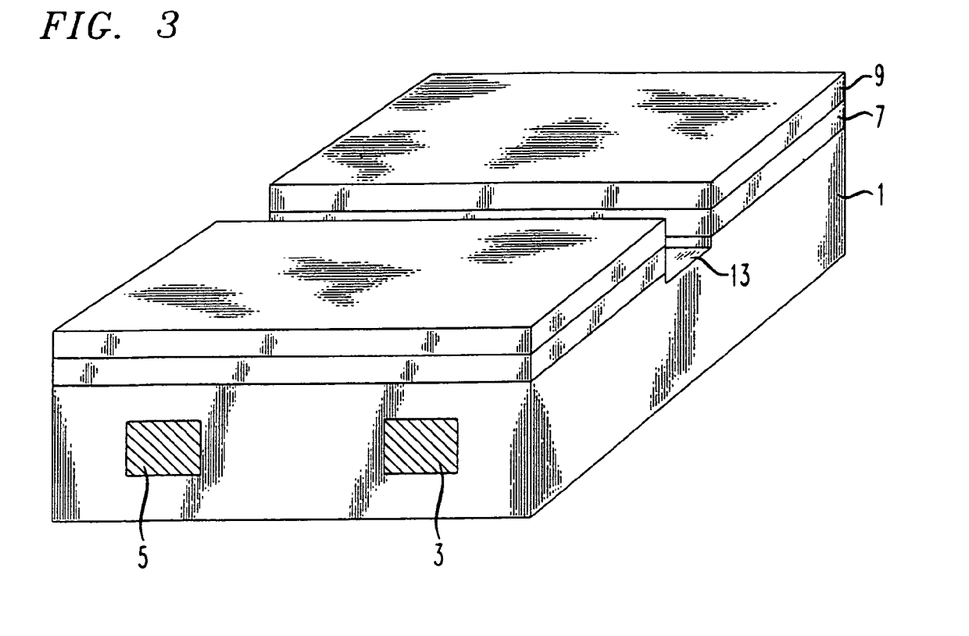
FIG. 3 is a perspective view of the above embodiment wherein the hardmask has been etched through and the dielectric has been partially etched through to form a trench.
Figure 4:
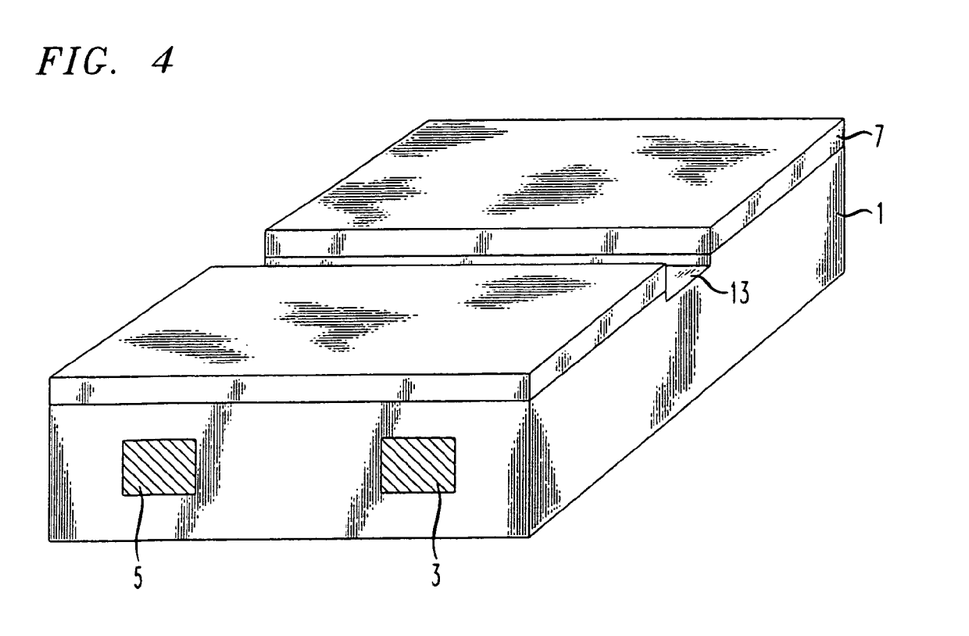
FIG. 4 is a perspective view of the above embodiment wherein the first photoresist has been removed.
Figure 5A:
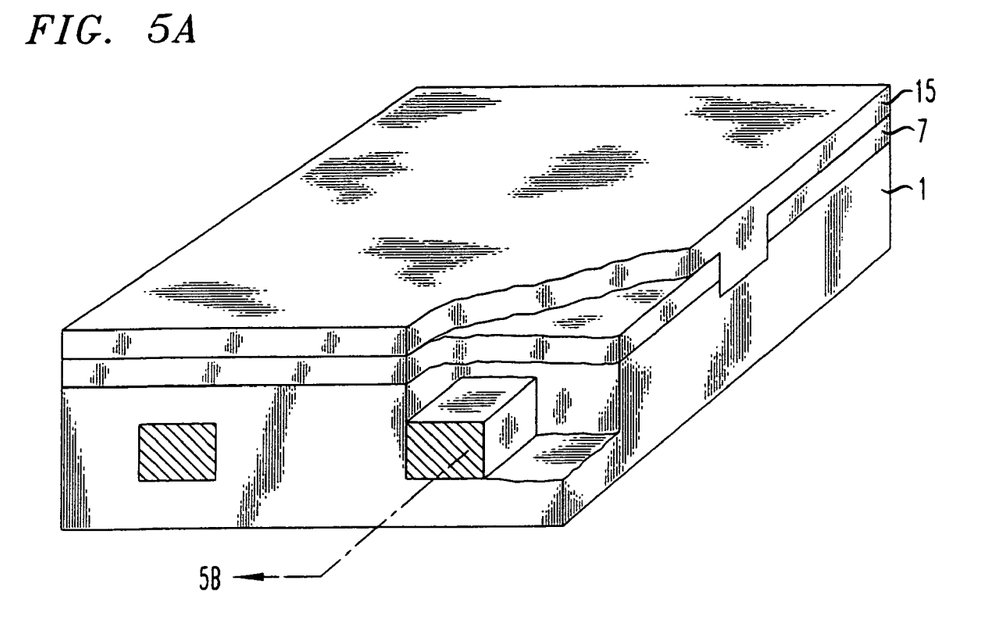
FIG. 5A is a perspective view of the: above embodiment wherein a second photoresist has been applied.
Figure 5B:
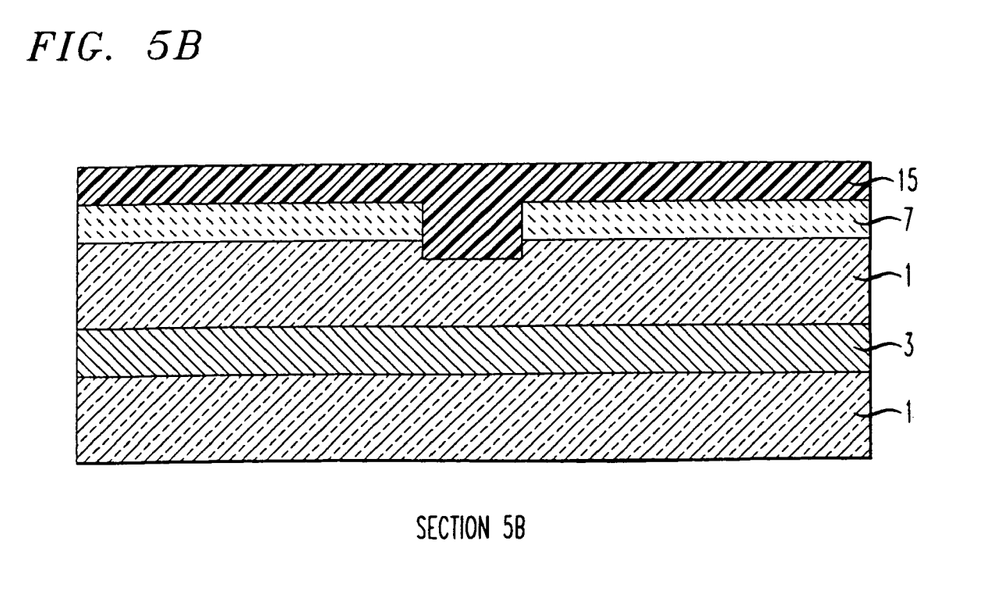
FIG. 5B is a section of FIG. 5A.
Figure 6A:
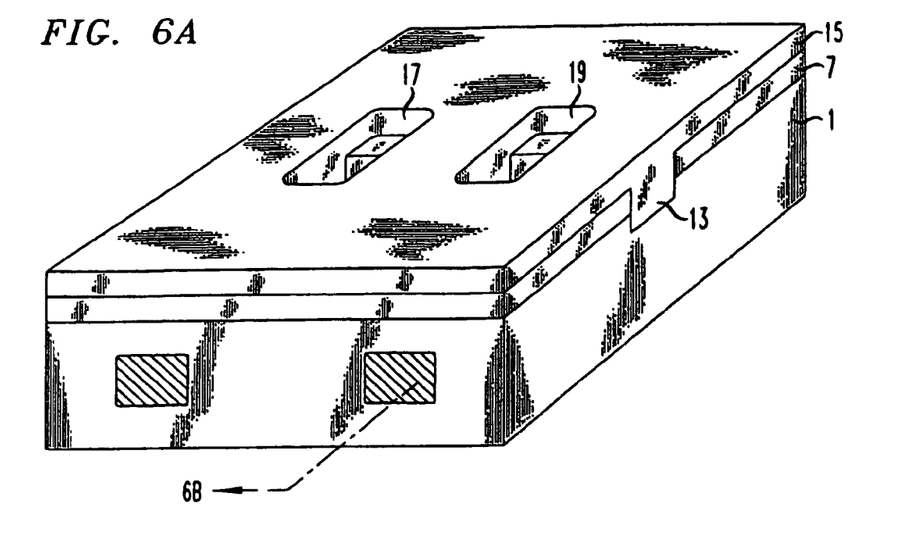
FIG. 6A is a perspective view of the above embodiment wherein the second photoresist has had slits across the trench photodefined therein.
Figure 6B:
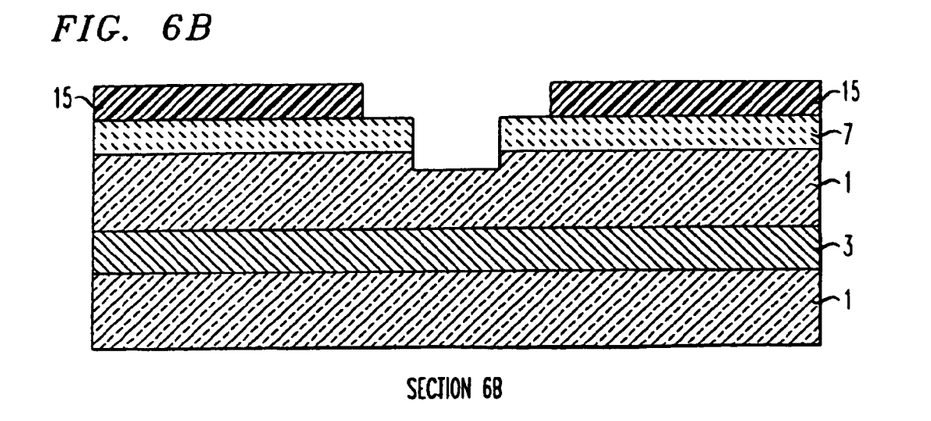
FIG. 6B is a section of FIG. 6A.
Figure 6C:
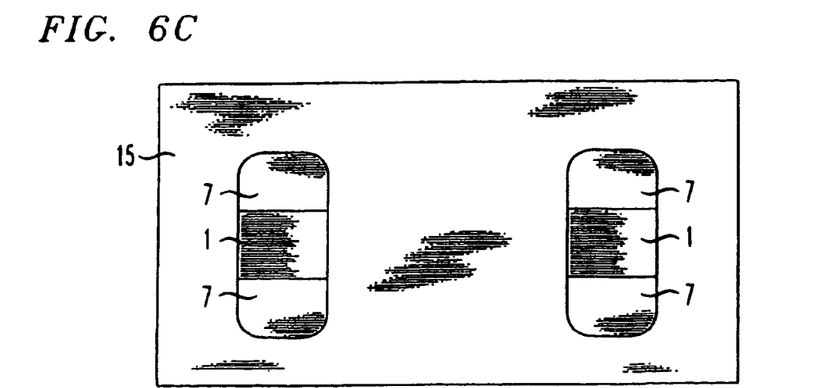
Figure 7A:
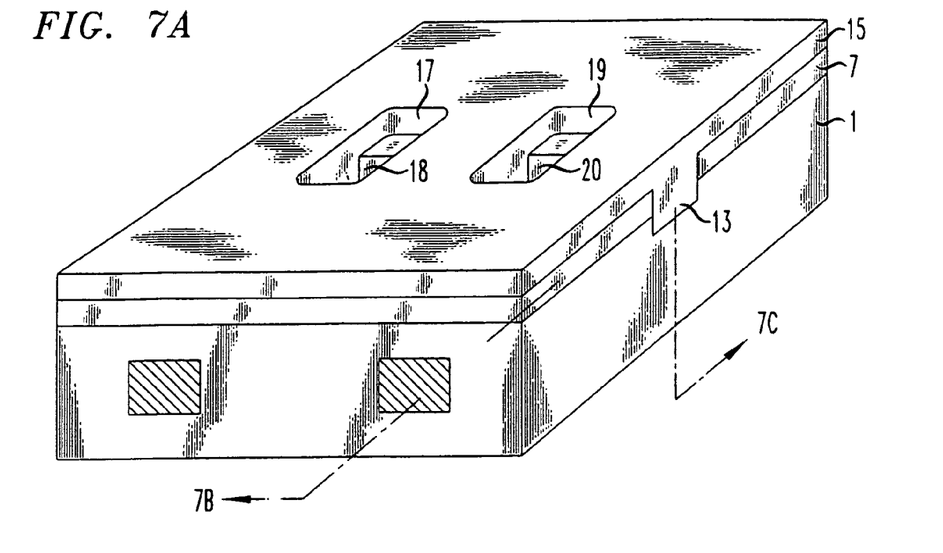
FIG. 7B is a section of FIG. 7A.
FIG. 7C is a section of FIG. 7A.
FIG. 7D is a plan view of FIG. 7A.
Figure 7B:
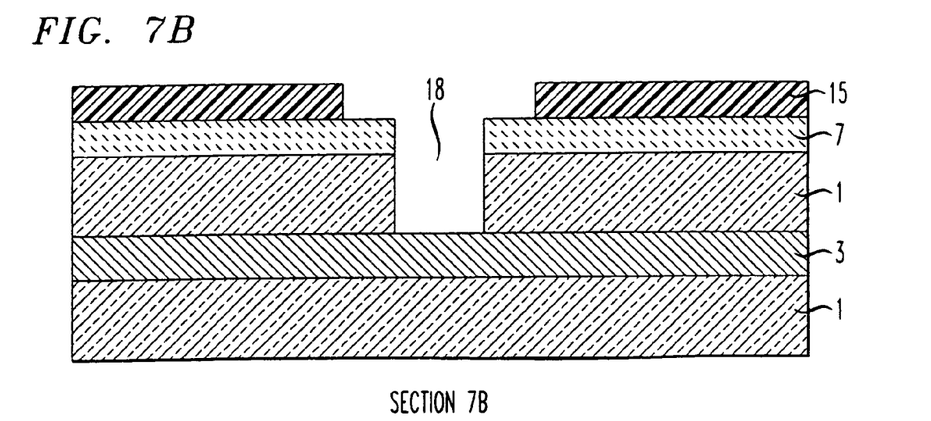
Figure 7C:
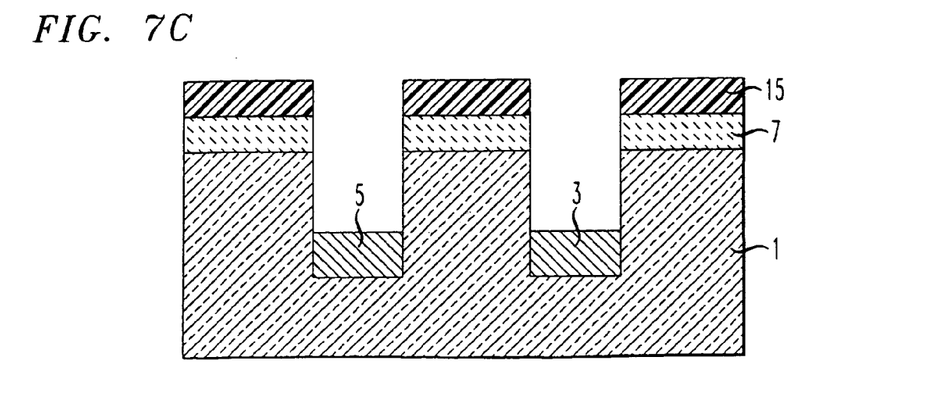
Figure 7D:
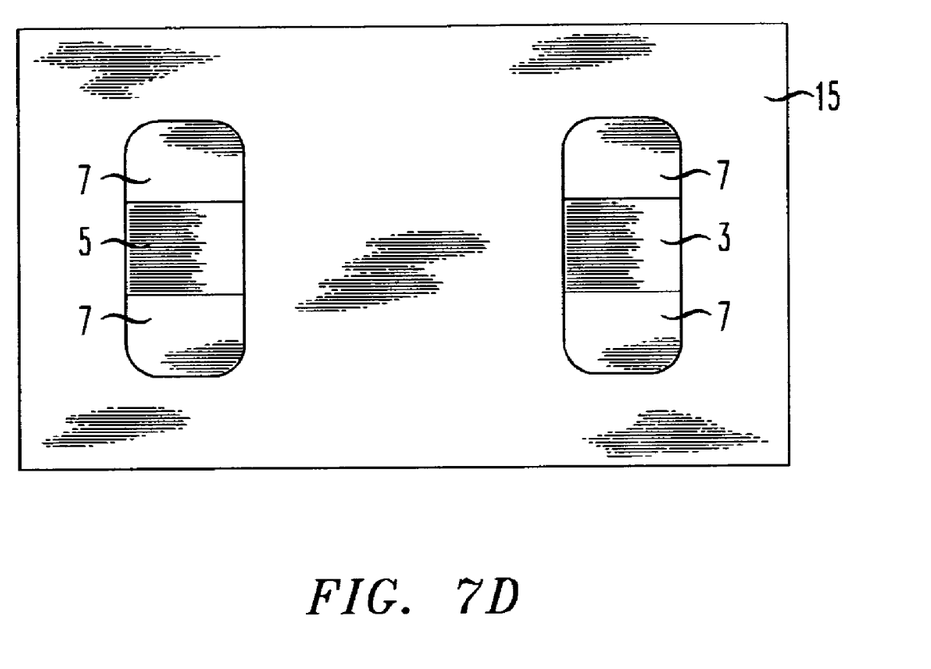
Figure 8A:
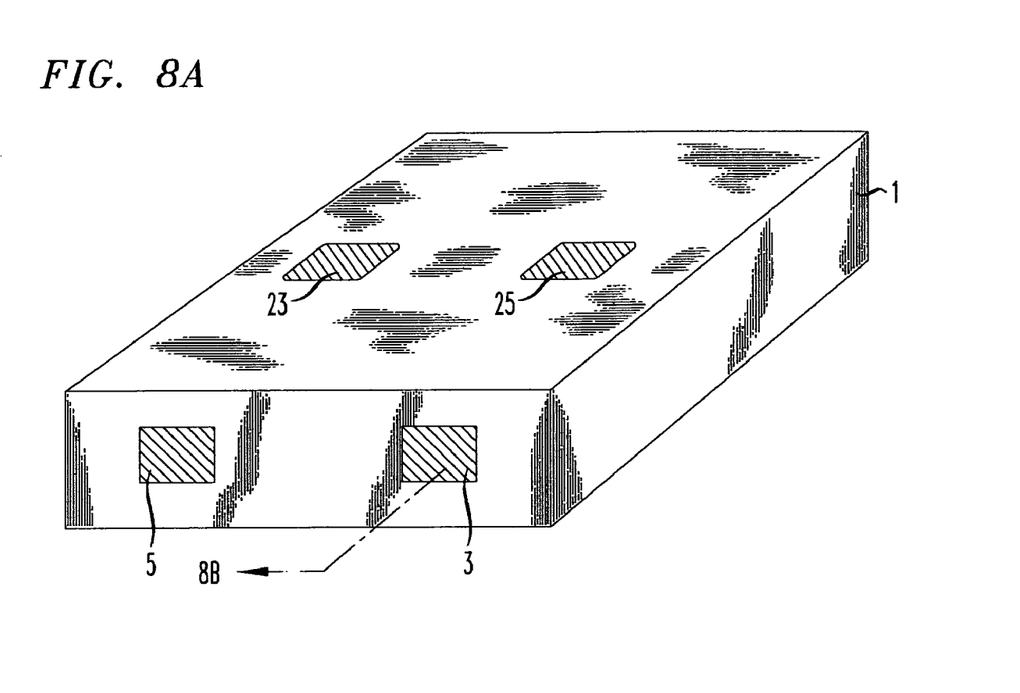
FIG. 8A is a perspective view of the above embodiment after metallization and planarization that has removed the second photoresist, the hardmask and some of the dielectric.
Figure 8B:
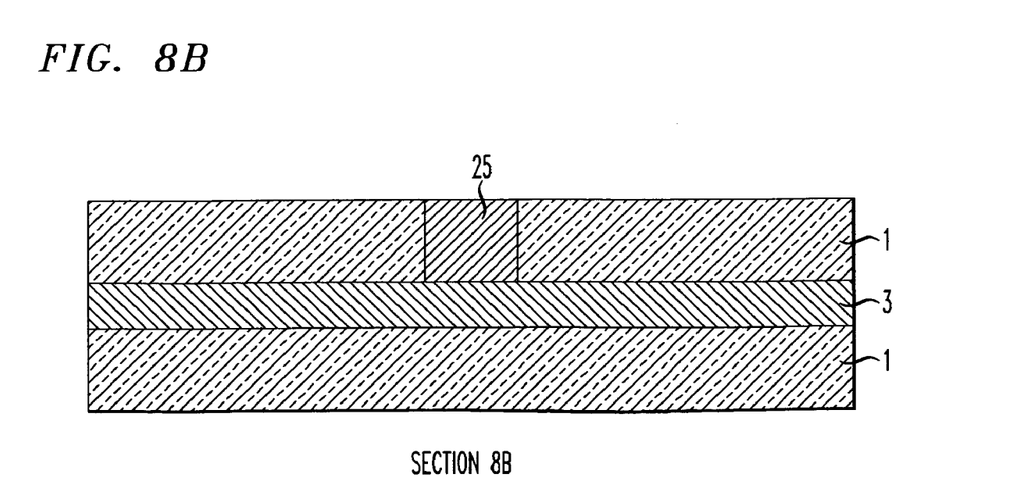
FIG. 8B is a section of FIG. 8A.

Referring now to the drawing, wherein like reference numerals refer to like elements throughout, FIG. 1 shows an perspective view of a dielectric 1, such as silicon dioxide, having two conductors 3 and 5, made of a conductive material such as such as copper, and having applied thereon a hardmask 7, such as silicon nitride and a first photoresist 9 in an exemplary embodiment of the invention. The first photoresist next has a first elongated opening or slit 11 for etching a trench photodefined therein, as shown in FIG. 2. The silicon nitride dielectric is then etched through and the silicon dioxide dielectric is partially etched, "partially" meaning not etched all the way down to conductive materials 3 and 5, through to deepen the first elongated opening 11 to form a trench 13, as shown in FIG. 3. The first photoresist 9 is removed, as shown in FIG. 4, and a second photoresist 15 is applied, as shown in FIGS. 5A and 5B. The second photoresist is patterned to form a second set of elongated openings 17 and 19 across the trench 13, as shown in FIGS. 6A, 6B and 6C. Note that the plan view, FIG. 6C, shows the square cross-section of silicon dioxide exposed for etching. Etching that is selective for the silicon dioxide dielectric 1, but not for the silicon nitride hardmask 7 or photoresist 15, causes the formation of square third openings 18 and 20 from the bottom of the trench 13 to the top of the conductors 3 and 5, as shown in FIGS. 7A, 7B, 7C and 7D. FIGS. 8A and 8B show the structure after metallization, which fills the third openings 18 and 20, and then planarization to remove the second photoresist, hard mask and excess metal, producing the desired square connections such as vias or contacts 23 and 25. A via provides connection between levels, while a contact may be a bond pad, or be topped with a bond pad, for wire bonding and the like. Conductors 3 and 5 may be made of the same or different conductive material as vias or contacts 23 and 25.

The present invention improves lithography capabilities to define small contact and via features by self-alignment in one direction. Note that the process flow above avoids using a high dielectric constant interlayer as an etch stop, such as silicon nitride, as is done in conventional dual damascene processes.

The process of the present invention includes using a hardmask and a photoresist to define the contact and via after fabricating an oxide trench with a dual damascene process. After the trench etch, instead of defining the contact or via as a round hole as is done conventionally, a slit is printed traversing the dielectric trench with the width of contact or via design rule. Another dimension of the contact or via is defined by the width of the trench. Since the intersection of the slit width and the width of the trench can occur anywhere on the length of the slit, the process of the present invention is self-aligning in the dimension of the slit. This solves the problem of alignment in at least one direction because one mask can be slid along the direction of its elongated opening, but the opening that is defined by its intersection with the elongated opening in the other mask will remain in the same place. Then, a high selectivity (with respect to hard mask and photo resist) anisotropic dielectric etch process is used to define the contact or via down to the previous conductive material level. The slit is preferably transverse and perpendicular to the trench, but it may be any angle so long as the slit is not parallel to the trench. The cross-section shape of the via defined by the intersection of the trench and the slit is generally that of a quadrilateral. The shape will be square if the slit and trench are of equal width, rectangular if they are not and a parallelogram or rhomboid if the slit is not perpendicular to the trench. In this way, contact area is maximized as compared to more circular cross-sections. The feature size of quadrilateral vias and contacts of the present invention are 0.5 micron and below; 0.25 is preferred and 0.18 to 0.16 and 0.14 are particularly preferred, even 0.12 micron and smaller is possible.

The hardmask is selected to act as an etch stop for the selective etching that occurs after the second photoresist is deposited, because the etching is selective for the dielectric, not the hardmask. For example, if the dielectric is silicon dioxide or nanoporous glass, the hardmask may be a layer like silicon nitride, which is relatively resistant to fluorinated etchants that attack silicon dioxide like plasmas containing $CH_2F_2$, $C_4F_8H_2$ and the like. Silicon dioxide in turn can act as a hardmask for low-k polymers such as benzcyclobutane and fluorinated polymers as oxygen plasma etchants will leave the silicon dioxide substantially untouched and etch polymers. In contrast, the etching that occurs after the first photoresist need not be selective, although the etchants could be sequentially selective to hardmask and silicon dioxide. Etchants such as hot phosphoric acid plus HF will etch both the silicon nitride and the underlying silicon dioxide. Note that silicon nitride has a dielectric constant (k) of about 7.8 compared to about 4 for silicon dioxide, while the low-k polymeric materials have dielectric constants of about 2.7 and nanoglass can have k values of about 2 or less. Fluorinated silicate glass is sometimes used for low-k applications and has a k of about 3.5

Note that since the hardmask is generally and advantageously, but not necessarily, removed in the present invention, the hardmask may include materials not generally used in the prior art, such as electrically conductive materials. Useful hardmasks include silicon oxynitride, soda-lime glass, borosilicate glass, phosphosilicate glass, borophosphosilicate glass, polysilicon, and molybdenum, tantalum titanium tungsten cobalt nickel palladium platinum silicides and nitrides, molybdenum, tungsten, titanium-tungsten alloy, aluminum oxide, aluminum nitride, titanium dioxide, titanium nitride and chromium.

Thereafter, the hardmask may be removed by conventional techniques. Removal of the photoresist and the hardmask may occur during planarization rather than requiring a separate step. Removal of the hardmask is optional for integrated circuits that do not require low capacitance. Note that generally, however, there will not be an etch stop layer at the bottom of the trench structure, the presence of which is sometimes indicative of prior art dual damascene formation techniques.

The conductive materials include metals like tungsten, copper, aluminum and their alloys, and doped polysilicon. The metallization materials may be the same or different as the above and are deposited by convention techniques such as electrolytic and electroless plating, physical vapor deposition, chemical vapor deposition and the like.

Those skilled in the art will appreciate that when the dielectric is silicon dioxide, it will usually be silicon dioxide grown or deposited on an underlying silicon wafer.

Advantages of the present invention include:

Improved lithography capability. For lithography processes, exposing a slit is less challenging than exposing a hole. Lithography process margin can be further enhanced through the use of thinner resists.

Semi-self alignment for increased contact and via area. In general, metal lines are designed across each other between levels. Using trench width to define the length of the contact or via achieves a larger inter-level contact area. This also enables vias and subsequent metal trench levels to be designed with substantially no misalignment tolerance with little or no detriment.

Less need for large depth of field because the stack-up of layers of the present invention need not include an etch stop layer.

Reduced backend capacitance. The present invention provides for low circuit capacitance because the high dielectric constant etch stop layer of the prior art is not required.

The foregoing has disclosed preferred and alternative features and embodiments of the present invention so that one of ordinary skill in the art may better understand the detailed description of the invention that follows. Additional features of the invention will be described hereinafter that form the subject of the claims of the invention. To this end, the improved lithography, semi-self alignment and reduced backend capacitance realized through the present invention form the basis of the claimed invention. One of ordinary skill in the art having the benefit of the present disclosure can appreciate that he can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A process for manufacturing an integrated circuit, the process comprising:
   providing a substrate comprising a dielectric layer over a conductive material;
   depositing a hardmask over the dielectric layer;
   applying a first photoresist over the hardmask and photodefining at least one first elongated opening;
   etching the hardmask and partially etching the dielectric to deepen the at least one first elongated opening to form a trench the trench having a bottom in the dielectric layer wherein the hardmask is not in contact with the bottom of the trench
   removing the first photoresist;
   applying a second photoresist and photodefining at least one second elongated opening transverse to the at least one trench so as to expose a portion of the dielectric defined by an intersection of the first and second openings;
   etching the exposed dielectric from the bottom of the at least one trench down to the underlying conductive material.

2. The process of claim 1, further comprising removing the second photoresist.

3. The process of claim 1, further comprising removing the hardmask.

4. The process of claim 1, further comprising metallization and planarization.

5. The process of claim 1, wherein the dielectric layer is silicon dioxide.

6. The process of claim 1, wherein the hardmask is silicon nitride.

7. The process of claim 1, wherein the step of etching the exposed dielectric from the bottom of the at least one trench down to the underlying conductive material forms at least one third opening to the underlying conductive material and the at least one third opening is filled with conductive material to form a contact or a via.

8. The process of claim 1, wherein the step of etching the exposed dielectric forms at least one third opening that has substantially a quadrilateral cross-section.

9. The process of claim 1, wherein the step of etching the exposed dielectric forms at least one third opening that has substantially a square cross-section.

10. The process of claim 1, wherein the step of etching the exposed dielectric forms at least one third opening that has substantially a rectangular cross-section.

11. The process of claim 1, wherein the step of etching the exposed dielectric forms at least one third opening that has a feature size of about 0.5 micron or less.

12. A process for manufacturing an integrated circuit, the process comprising:
   providing a substrate comprising silicon dioxide dielectric layer over a conductive material;
   depositing a silicon nitride hardmask over the dielectric layer;
   applying a first photoresist over the hardmask and photodefining at least one elongated opening;
   etching the hardmask and partially etching the dielectric to deepen the at least one elongated opening to form at least one trench, the trench forming a bottom in the dielectric layer wherin in the hardmask is not in contact with the bottom of the trench stripping the first photoresist;
   applying a second photoresist and photodefining at least one second elongated opening transverse to the at least one trench so as to expose a portion of the dielectric defined by an intersection of the first and second openings;
   selectively etching the dielectric from the bottom of the trench down to the underlying conductive material.

13. The process of claim 1 wherein the second opening is perpendicular to the first opening.

14. The process of claim 12 wherein the second opening is perpendicular to the first opening.

* * * * *